United States Patent
Watada et al.

(10) Patent No.: US 11,945,755 B2
(45) Date of Patent: Apr. 2, 2024

(54) CERAMIC STRUCTURE AND STRUCTURE WITH TERMINAL

(71) Applicant: KYOCERA Corporation, Kyoto (JP)

(72) Inventors: Kazuo Watada, Koka (JP); Tooru Matsuoka, Higashiomi (JP)

(73) Assignee: Kyocera Corporation

( * ) Notice: Subject to any disclaimer, the term of this patent is extended or adjusted under 35 U.S.C. 154(b) by 286 days.

(21) Appl. No.: 17/291,928

(22) PCT Filed: Nov. 22, 2019

(86) PCT No.: PCT/JP2019/045835
§ 371 (c)(1),
(2) Date: May 6, 2021

(87) PCT Pub. No.: WO2020/110954
PCT Pub. Date: Jun. 4, 2020

(65) Prior Publication Data
US 2022/0009841 A1    Jan. 13, 2022

(30) Foreign Application Priority Data

Nov. 30, 2018 (JP) .................................. 2018-224676

(51) Int. Cl.
*C04B 37/02* (2006.01)
*H05B 3/14* (2006.01)

(52) U.S. Cl.
CPC ............ *C04B 37/02* (2013.01); *H05B 3/141* (2013.01); *H05B 3/143* (2013.01); *C04B 2237/12* (2013.01)

(58) Field of Classification Search
CPC ........ H05B 3/141; H05B 3/143; C04B 37/02; C04B 2237/12; C04B 37/028; C04B 2237/124; C04B 2237/125; C04B 2237/403; C04B 2237/343; C04B 2237/123; C04B 2237/368; C04B 2237/365; C04B 2237/408;
(Continued)

(56) References Cited

U.S. PATENT DOCUMENTS

| | | | |
|---|---|---|---|
| 6,133,557 A * | 10/2000 | Kawanabe | ............... H05B 3/30 501/153 |
| 2002/0027130 A1* | 3/2002 | Miyata | ................... H05B 3/283 219/544 |
| 2016/0099164 A1 | 4/2016 | Kataigi et al. | |

FOREIGN PATENT DOCUMENTS

| JP | H4-198069 A | 7/1992 |
|---|---|---|
| JP | H11-220008 A | 8/1999 |

(Continued)

*Primary Examiner* — Eric S Stapleton
(74) *Attorney, Agent, or Firm* — Procopio, Cory, Hargreaves & Savitch LLP (57) ABSTRACT

A heater includes a base body, terminal and joining layer. The base body is made of ceramic. The joining layer contains metal as a principal ingredient and is located between the base body and the terminal. The base body includes a first surface and second surface. The first surface faces an outer side of the base body and includes at least one of a region which is superimposed on the terminal and a region which is located on a periphery of the terminal. The second surface intersects with the first surface and is located on the side closer to an internal portion of the base body on the side away from the first surface. The joining layer extends from the terminal and first surface up to the second surface.

14 Claims, 7 Drawing Sheets

(58) Field of Classification Search
CPC .......... C04B 2237/76; C04B 2237/366; C04B 2237/708; B32B 18/00; H01L 21/683
USPC ........................................................ 219/544
See application file for complete search history.

(56) References Cited

FOREIGN PATENT DOCUMENTS

| | | |
|---|---|---|
| JP | 2003-311934 A | 11/2003 |
| WO | 2015/146563 A1 | 10/2015 |

\* cited by examiner

CERAMIC STRUCTURE AND STRUCTURE WITH TERMINAL

TECHNICAL FIELD

The present disclosure relates to a ceramic structure and a structure with terminal.

BACKGROUND ART

Known in the art is a ceramic structure using ceramic as a base body, and a structure with terminal comprised of an insulating base body on which the terminal is bonded. As examples of the ceramic structure and the structure with terminals, for example, there can be mentioned a ceramic heater, a wafer, an electrostatic chuck, and a plasma generation-use electrode member which are utilized for processing. In the ceramic structure and structure with terminals, the base body and metal members (for example terminals) are joined together.

Patent Literature 1 discloses a joint structure of a ceramic plate and a metal member. In this joint structure, the ceramic plate has a projecting portion on one major surface of a pair of major surfaces (broadest surfaces of a plate shape, front surface and back surface). The projecting portion has a flat top face. The metal member has a joining surface which faces this top face. Further, a brazing material is placed between the top face and the joining surface whereby the ceramic plate and the metal member are joined.

CITATION LIST

Patent Literature

Patent Literature 1: International Patent Publication No. 2015/146563

SUMMARY OF INVENTION

A ceramic structure according to one aspect of the present disclosure includes a base body, a metal member, and a joining layer. The base body is made of ceramic. The joining layer contains metal as a principal ingredient and is located between the base body and the metal member. The base body comprises a first surface and a second surface. The first surface faces an outer side of the base body. Further, the first surface includes at least one of a region overlapping the metal member and a region located on a periphery of the metal member. The second surface intersects with the first surface and is located on the side closer to an internal portion of the base body the further from the first surface. The joining layer extends from the metal member and the first surface up to the second surface.

A structure with terminal according to one aspect of the present disclosure includes a base body, an internal conductor, a terminal, and a joining layer. The base body is an insulating member including a recessed portion. The internal conductor is located inside the base body. The terminal is inserted in the recessed portion and is electrically connected to the internal conductor. The joining layer joins the base body and the terminal. The base body includes a first surface and second surface. The first surface is located on a periphery of the recessed portion. The second surface intersects with the first surface and is located on the side closer to an internal portion of the base body the further from the first surface. The joining layer extends from the terminal and the first surface up to the second surface.

DESCRIPTION OF EMBODIMENTS

Below, a ceramic structure and a structure with terminal of the present disclosure will be explained by taking a heater as an example. The drawings which will be referred to below are schematic ones for convenience of explanation. Accordingly, sometimes details will be omitted. Further, the size ratios will not always coincide with the actual ones. Further, the heater may be further provided with known components which are not shown in the drawings.

(Heater System)

Figure 1:
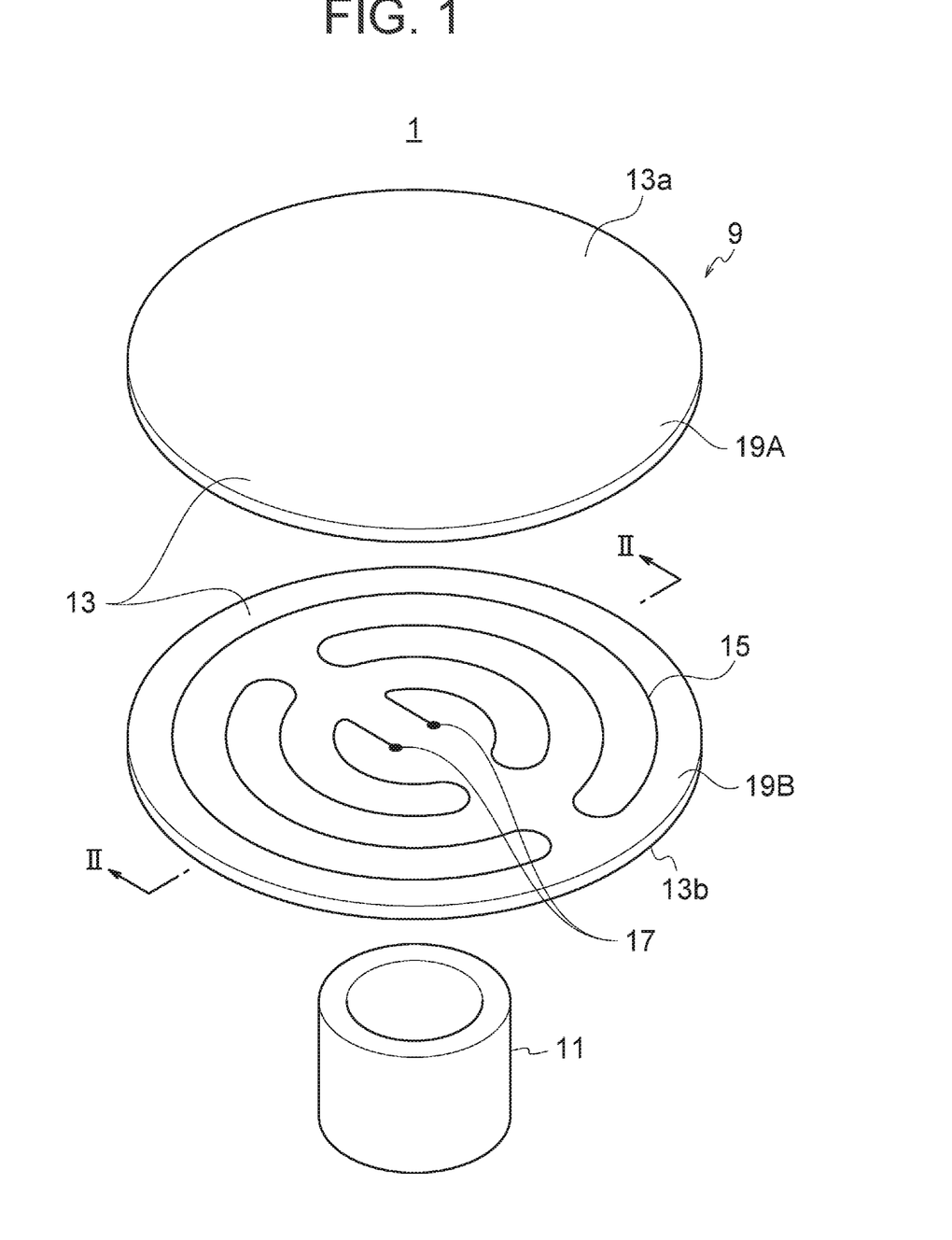
FIG. 1 is a schematic disassembled perspective view showing the configuration of a heater according to an embodiment.
Figure 2:
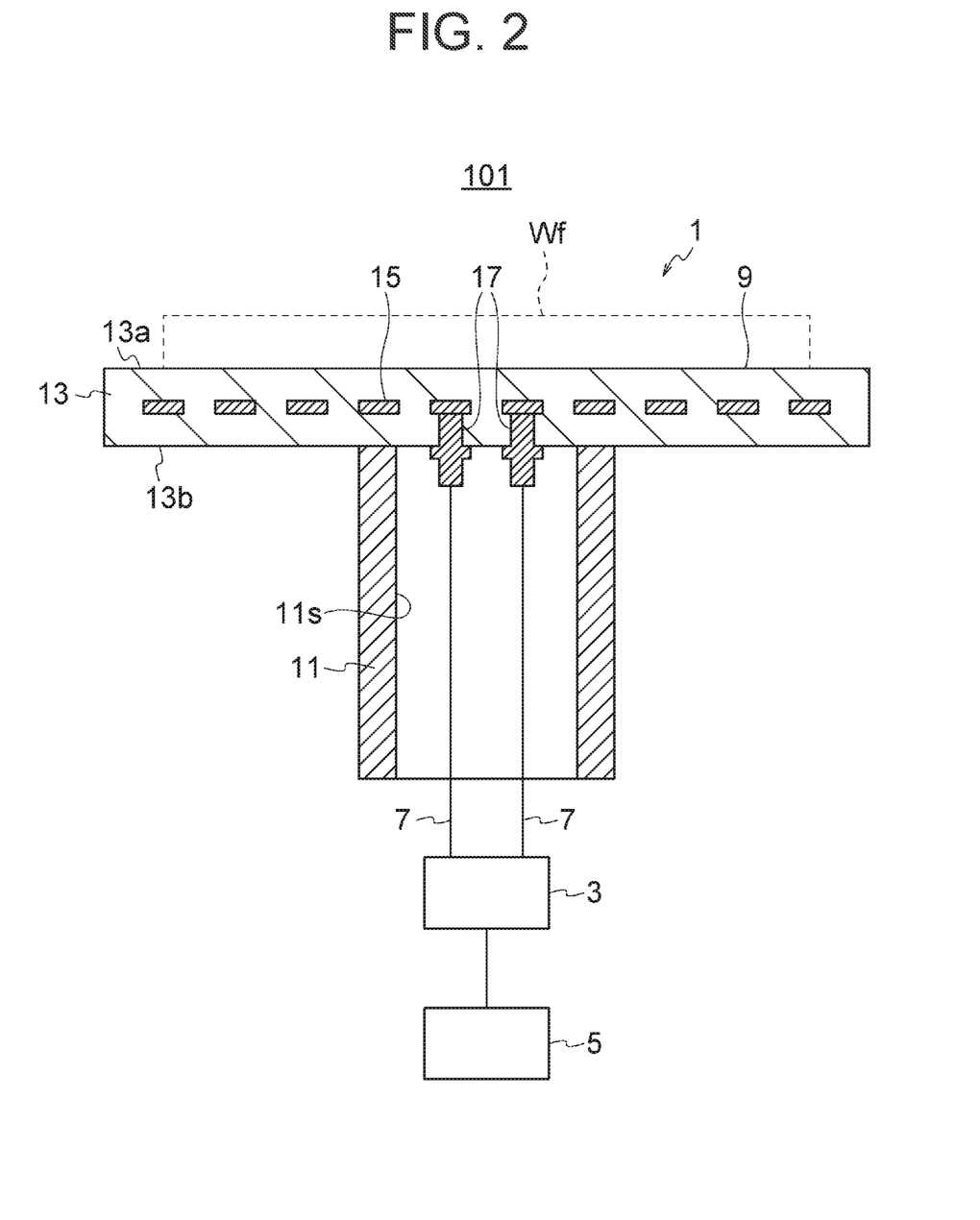
FIG. 2 is a cross-sectional view taken along the II-II line in FIG. 1.

FIG. 1 is a schematic disassembled perspective view showing the configuration of a heater 1 according to an embodiment. FIG. 2 is a schematic view showing the configuration of a heater system 101 including the heater 1 in FIG. 1. In FIG. 2, for the heater 1, a cross-sectional view along the II-II line in FIG. 1 is shown. FIG. 1 shows the heater 1 in a disassembled manner for convenience in order to show the structure of the heater 1. An actual heater 1 after completion need not be able to be disassembled as in the disassembled perspective view in FIG. 1.

The upper parts in the drawing sheets in FIG. 1 and FIG. 2 are for example vertically upward. However, the heater 1 need not be utilized assuming the upper parts in the drawing sheets in FIG. 1 and FIG. 2 are vertically upper parts. In the following explanation, for convenience, sometimes the "upper surface" and "lower surface" and other terms will be used where the upper parts in the drawing sheets in FIG. 1 and FIG. 2 are the vertically upper parts. When simply referred to as "when viewed on a plane", unless particularly explained otherwise, it designates "viewed from the upper parts in the drawing sheets in FIG. 1 and FIG. 2".

The heater system 101 has the heater 1, a power supply part 3 (FIG. 2) which supplies power to the heater 1, and a control part 5 (FIG. 2) which controls the power supply part 3. The heater 1 and the power supply part 3 are connected by wiring members 7 (FIG. 2). Note that, the wiring members 7 may be grasped as portions of the heater 1. Further, the heater system 101, other than the configurations explained above, for example, may have a fluid supply part which supplies gas and/or liquid to the heater 1.

(Heater)

The heater 1 for example has a substantially plate-shaped (disk-shaped in the example shown) heater plate 9 and a pipe 11 which extends downward from the heater plate 9.

The heater plate 9 has a wafer Wf (FIG. 2) placed (superposed) on its upper surface 13a as one example of a heated object and directly contributes to heating of the wafer. The pipe 11 for example contributes to support of the heater plate 9 and protection of the wiring members 7. Note that, the heater plate 9 alone may be grasped as the heater as well.

(Heater Plate)

The upper surface 13a and lower surface 13b of the heater plate 9 are for example substantially flat. The planar shape and various dimensions of the heater plate 9 may be suitably set considering the shape and dimensions etc. of the heated object. For example, the planar shape is circular (example shown) or polygonal (for example rectangular). When showing one example of dimensions, the diameter is 20 cm to 35 cm, and the thickness is 4 mm to 30 mm. Note that, in the explanation of the present embodiment, "rectangular" or other terms concerned with the polygonal shape may include a shape with corner portions chamfered by straight lines (planes) or curves (curved surfaces) unless particularly explained otherwise.

The heater plate 9 is for example provided with an insulating base body 13, a resistance heating element 15 (one example of the internal conductor) buried in the base body 13, and terminals 17 (one example of the metal member) for supplying power to the resistance heating element 15. By flow of current in the resistance heating element 15, heat is generated according to Joule's law and in turn the wafer placed on the upper surface 13a of the base body 13 is heated.

(Base Body)

The outer shape of the base body 13 forms the outer shape of the heater plate 9. Accordingly, the explanation relating to the shape and dimensions of the heater plate 9 explained above may be grasped as an explanation of the outer shape and dimensions of the base body 13 as it is. The material of the base body 13 is for example ceramic. The ceramic is for example a sintered body containing aluminum nitride (AlN), aluminum oxide ($Al_2O_3$, alumina), silicon carbide (SiC), silicon nitride ($Si_3N_4$), or the like as the principal ingredient. Note that, the principal ingredient is for example an ingredient accounting for 50 mass % or more or 80 mass % or more of the material (same is true for the other members and other materials unless particularly explained otherwise).

Here, the "principal ingredient" means an ingredient accounting for 60 mass % or more in the 100 mass % of ingredients configuring the ceramic. The ingredients configuring the ceramic may be identified by using an X-ray diffraction device (XRD). Further, the content of each ingredient may be obtained by finding the content of each element using an X-ray fluorescence analyzer (XRF) or ICP emission spectrum analyzer (ICP) and converting it to the content of each ingredient identified.

In FIG. 1, the base body 13 is configured by a first insulation layer 19A and second insulation layer 19B. Note that, the base body 13 may be prepared by materials forming the first insulation layer 19A and second insulation layer 19B (for example ceramic green sheets) stacked on each other or may be prepared according to a method different from such a method and may be only conceptually grasped to be configured by the first insulation layer 19A and second insulation layer 19B due to the presence of the resistance heating element 15 etc. after completion.

(Resistance Heating Element)

The resistance heating element 15 extends along (for example parallel to) the upper surface 13a and the lower surface 13b of the base body 13. Further, the resistance heating element 15, when viewed on a plane, for example, extends covering over substantially the entire surface of the base body 13. In FIG. 1, the resistance heating element 15 is positioned between the first insulation layer 19A and the second insulation layer 19B.

The specific pattern (route) of the resistance heating element 15 when viewed on a plane may be made a suitable one. For example, only one resistance heating element 15 is provided in the heater plate 9 and extends from one end to the other end without crossing itself. Further, in the example shown, the resistance heating element 15, in each of the regions obtained by dividing the heater plate 9 into two, extends so as to weave back and forth (meander) in a circumferential direction. Other than this, for example, the resistance heating element 15 may spirally extend or may extend so as to linearly weave back and forth in one radial direction.

The shape when locally viewing the resistance heating element 15 may be made a suitable one. For example, the resistance heating element 15 may be a layered conductor which is parallel to the upper surface 13a and lower surface 13b, may be coil shaped (spring shaped) wound using the above route as the axis, or may be formed in a mesh shape. Also, the dimensions in the various shapes may be suitably set.

The material of the resistance heating element 15 is a conductor (for example metal) which generates heat by flow of current. The conductor may be suitably selected. For example, it is tungsten (W), molybdenum (Mo), platinum (Pt), indium (In), or an alloy containing them as principal constituents. Further, the material of the resistance heating element 15 may be one obtained by firing a conductive paste including the metal as described before. That is, the material of the resistance heating element 15 may be one containing glass powder and/or ceramic powder (from another viewpoint, an inorganic insulation substance) or other additives.

(Terminals (Outline))

The terminals 17, for example, are connected to the two ends of the resistance heating element 15 in the long direction and, at the positions of the two ends, pass through parts of the base body 13 on the lower surface 13b side (second insulation layer 19B) to be exposed from the lower surface 13b. Due to this, it becomes possible to supply power from the exterior of the heater plate 9 to the resistance heating element 15. The pair of terminals 17 (two ends of the resistance heating element 15) are for example positioned on the center side in the heater plate 9. Note that, three or more terminals 17 supplying power to one resistance heating element 15 may be provided or two or more sets of terminals 17 supplying power to two or more (for example two or more layers of) resistance heating elements 15 may be provided.

(Pipe)

The pipe 11 is hollow shape opened at the top and bottom (two sides in the axial direction). From another viewpoint, the pipe 11 has a space 11s running through it from the top to bottom. The shapes of a transversal cross-section (cross-section perpendicular to the axial direction) and vertical cross-section (cross-section parallel to the axial direction, the cross-section shown in FIG. 2) in the pipe 11 may be suitably set. In the example shown, the pipe 11 is cylinder shaped with a constant diameter relative to the position in the axial direction. Naturally, the pipe 11 may differ in diameter according to the position in the height direction. Further, specific values of dimensions of the pipe 11 may be suitably set. Although not particularly shown, in the pipe 11, a channel in which gas or liquid flows may be formed.

The pipe 11 may be configured by ceramic or another insulation material or may be configured by a metal (conductive material). As specific materials of the ceramic, for example, ones (AlN etc.) given in the explanation of the base body 13 may be utilized. Further, the material of the pipe 11 may be the same as the material of the base body 13 or may be different from the latter.

The base body 13 and the pipe 11 may be fixed together out by a suitable method. For example, the two may be fixed together by an adhesive (not shown) interposed between the two, may be fixed together by solid phase bonding without an adhesive interposed between the two, or may be mechanically fixed together by utilizing bolts and nuts (both not shown).

(Wiring Member)

The wiring members 7 are inserted in the space 11s in the pipe 11. The plurality of terminals 17 are exposed from the base body 13 in a region in the heater plate 9 which is exposed to the space 11s in a plane perspective. Further, the wiring members 7 are connected at single ends to the plurality of terminals 17.

The plurality of wiring members 7 may be flexible electrical wires, may be rod-shaped conductors without flexibility, or may be a combination of the same. Further, the plurality of flexible electrical wires may be bundled together so as to become like one cable or need not be bundled together.

Further, the connections between the wiring members 7 and the terminals 17 may be suitable ones. For example, the two may be joined by a conductive bonding material. Further, for example, the two may be screwed together by forming a male screw in one and forming a female screw in the other. The terminals 17 may have specific shapes for connection with the wiring members 7 like the screws explained before. In the following explanation, however, illustration of such specific shapes will be basically omitted.

(Joining Structure of Terminals)

Figure 3:
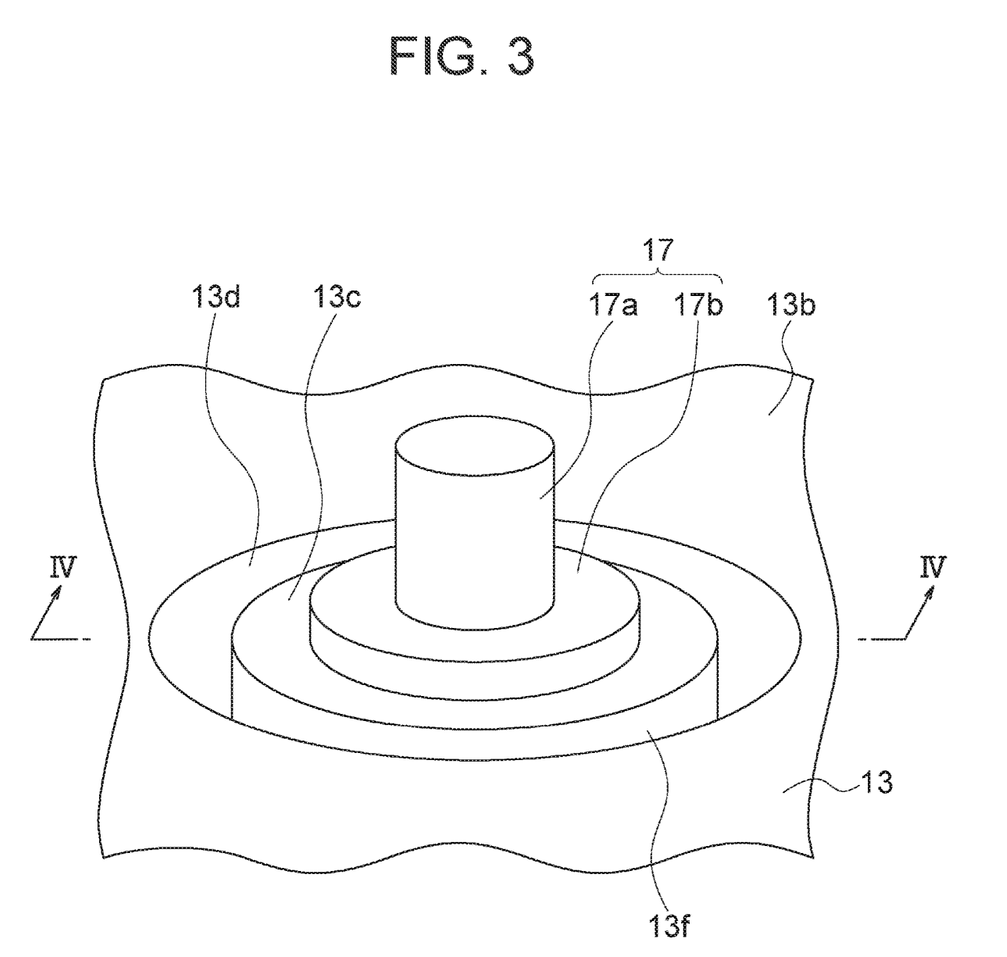
FIG. 3 is a perspective view of a terminal in the heater plate in FIG. 1 and its periphery seen from a lower surface side.
Figure 4:
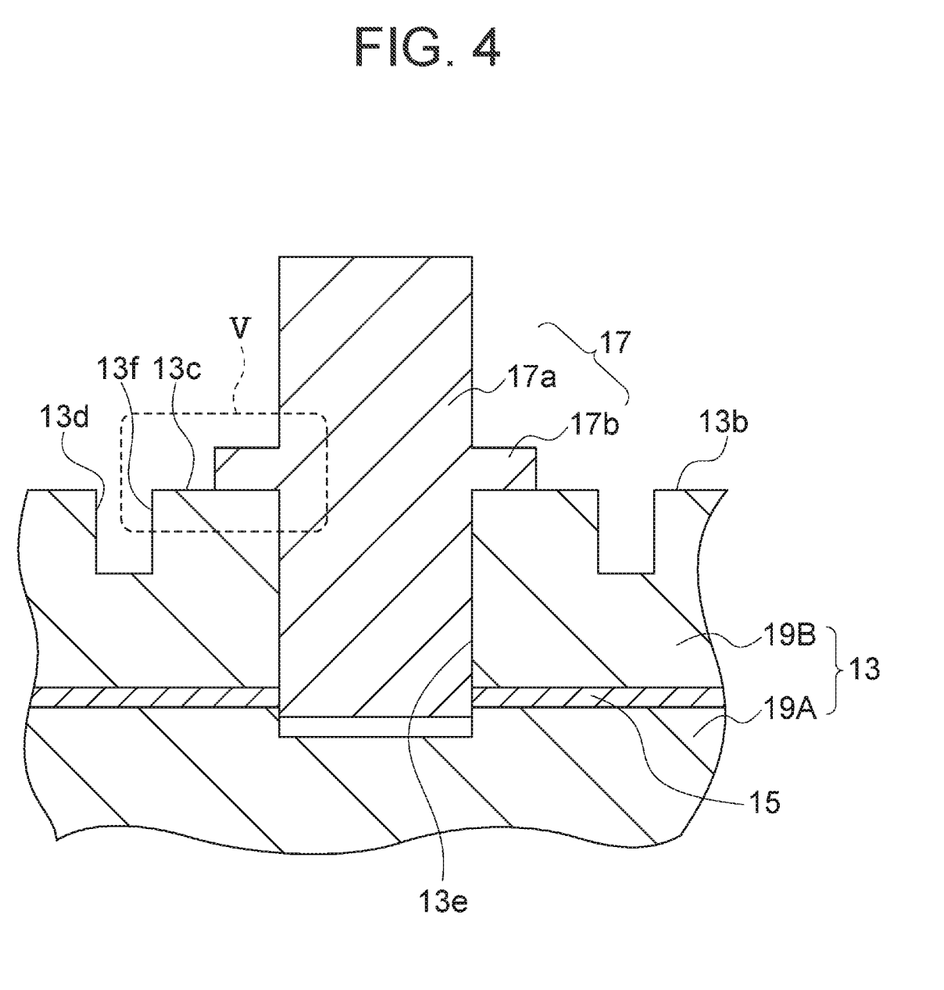
FIG. 4 is a cross-sectional view taken along the IV-IV line in FIG. 3.

FIG. 3 is a perspective view of a terminal 17 in the heater plate 1 and its periphery seen from the lower surface 13b side. FIG. 4 is a cross-sectional view taken along the IV-IV line in FIG. 3. In these views, the upper part in the drawing sheet is the lower part in the heater plate 1.

The terminal 17 for example has a shaft-shaped terminal body 17a and a flange 17b which projects from the outer circumferential surface (surface around the shaft) of the terminal body 17a.

The specific shape and various dimensions etc. of the terminal body 17a may be suitably set. For example, as in the example shown, the terminal body 17a may be column-shaped so as to linearly extend in the vertical direction (thickness direction of the base body 13). In this case, the length of the terminal body 17a in the vertical direction may be larger than the diameter (example shown) or may be equal to or smaller than the diameter. Further, the shape and size of the transversal cross-section parallel to the base body 13 in the terminal body 17a may be constant or may not be constant in the vertical direction (thickness direction of the base body 13). The shape of the transversal cross-section may be made a circular shape (example shown) or a polygonal shape or other suitable shape.

The terminal body 17a may be solid as in the example shown. Otherwise, unlike the example shown, it may be formed with a female screw or otherwise be hollow-shaped. Further, although not particularly shown, the terminal body 17a may be made a rod shape with a relatively long length extending out of the lower surface 13b. In this case, for example, the length extending out from the lower surface 13b of the terminal body 17a may be made 2 times or more or 5 times or more of the thickness of the base body 13.

The specific shape and various dimensions etc. of the flange 17b may also be suitably set. For example, when viewed on a plane, the shape of the outer edge of the flange 17b may be made a shape of the shape of the outer circumferential surface of the terminal body 17a made one size larger (example shown) or may be made a shape different from the shape of the outer circumferential surface of the terminal body 17a. In other words, the width (distance from the inner edge to the outer edge when viewed on a plane) of the flange 17b may be constant around the terminal body 17a or may not be constant. The thickness (vertical direction) of the flange 17b may be constant (example shown) or may not be constant in the direction around the terminal body 17a and/or direction from the inner edge to the outer edge. The flange 17b (its lower surface and/or upper surface) may be perpendicular (example shown) or may not be perpendicular with respect to the terminal body 17a.

The position of the flange 17b in the vertical direction with respect to the terminal body 17a may be suitably set. In the example shown, the flange 17b is positioned midway in the long direction with respect to the terminal body 17a. However, unlike the example shown, the flange 17b may be positioned at the end part in the terminal body 17a on an opposite side (upper part in the drawing sheet) to the resistance heating element 15 as well. In other words, the terminal body 17a need not project from the flange 17b to the upper part in the drawing sheet.

The terminal 17, for example, is configured in its entirety integrally by the conductor. However, although not particularly shown, the terminal 17 may be also configured by an insulator covered by a conductor film. The material of the conductor configuring the terminal 17 may be made a suitable one. Typically, the material of the conductor is a metal. Further, the material of the terminal 17 may be a material which is the same as or contains the same principal ingredients as the material of the internal conductor (resistance heating element 15) and/or material of the wiring member 7 or may not be such a material. As the material of the terminal 17, for example, W, Mo, or Pt can be mentioned.

The terminal 17, as in the example shown, may pass through the resistance heating element 15 and be connected to the resistance heating element 15 at its side surface (example shown) or may not pass through the resistance heating element 15 and be connected with the resistance heating element 15 at its upper surface (surface on the lower side in the drawing sheet).

The lower surface 13b of the base body 13 includes the first surface 13c. The first surface 13c is a region in the lower surface 13b between a later explained groove 13d and recessed portion 13e and faces the lower part of the base body 13 (upper part in the drawing sheet, from another viewpoint, the external portion of the base body 13 or the opposite side to the resistance heating element 15). The first surface 13c is for example planar-shaped facing the same direction as the majority (for example 80% or more) of the lower surface 13b. The first surface 13c may be positioned in a lower part relative to a rest of the region of the lower surface 13b (part or all of the region on the outer side from the groove 13d), may be flush relative to the rest (example shown), or may be positioned in an upper part relative to the rest. For example, although not particularly shown, a recessed portion may be formed in a region on the center side of the lower surface 13b, and the groove 13d may be formed at a position on the bottom surface of that recessed portion away from the inner circumferential surface of the recessed portion.

The base body 13 has a recessed portion 13e (FIG. 4) which opens in the first surface 13c. The recessed portion 13e passes through at least the second insulation layer 19B and reaches the resistance heating element 15. The terminal 17 is at least partially positioned inside the recessed portion 13e. Due to this, the terminal 17 becomes able to be connected to the resistance heating element 15 which is positioned inside the base body 13. Further, a portion in the terminal 17 on the side away from the resistance heating element 15 (upper part in the drawing sheet) is exposed from the first surface 13c. Due to this, the terminal 17 becomes able to be connected to the wiring member 7. Note that, although not particularly shown, a not shown wiring layer electrically connected to the resistance heating element 15 may be provided between the resistance heating element 15 and the lower surface 13b of the base body 13, and the terminal 17 may be connected to the wiring layer.

By insertion of the part in the terminal body 17a which projects to the resistance heating element 15 side more than the flange 17b into the recessed portion 13e, the flange 17b is engaged with respect to the first surface 13c. In other words, the first surface 13c has a region overlapping the terminal 17. This overlapping region may be grasped as a region positioned on the periphery of the terminal 17 (more strictly speaking, the terminal body 17a) as well.

The width (length from the inner edge to the outer edge) of the flange 17b is for example smaller than the width (length from the recessed portion 13e to the groove 13d) of the first surface 13c. From another viewpoint, the outer edge of the flange 17b is positioned on the inner side (on the terminal body 17a side) from the outer edge of the first surface 13c. Accordingly, the first surface 13c has a region which is positioned on the periphery of the terminal 17 (more strictly speaking, the flange 17b). However, the outer edge of the flange 17b may substantially coincide with the outer edge of the first surface 13c or may be positioned on the outer side from the outer edge of the first surface 13c.

The specific shape and dimensions etc. of the recessed portion 13e may be suitably set. For example, the shape of the recessed portion 13e is a shape of the shape of the portion in the terminal 17 which is inserted in the recessed portion 13e made somewhat larger. The size of the clearance between the two may be suitably set so that the joining material (joining layer 21) which will be explained later can be arranged. The bottom surface of the recessed portion 13e and the front end surface of the terminal 17 on the interior side of the base body 13 need not abut or need not be joined, but may be separated (example shown) or may abut or be joined.

The base body 13 has the groove 13d in the lower surface 13b as already explained. The groove 13d for example extends so as to surround the terminal 17 at a position separated from the terminal 17. From another viewpoint, the groove 13d surrounds the first surface 13c. By formation of the groove 13d, the base body 13 has a second surface 13f (wall surface on the first surface 13c side in the groove 13d) which intersects with the first surface 13c and is positioned on the side closer to the internal portion of the base body 13 the further from the first surface 13c.

The specific shape and dimensions etc. of the groove 13d (second surface 13f) may be suitably set. For example, the groove 13d may surround the terminal 17 without interruption (example shown) or may be interrupted in part (not limited to one portion). Further, the distance of the groove 13d (second surface 13f) from the terminal 17 (in the present embodiment, strictly speaking, the outer edge of the flange 17b) may be constant in the direction around the terminal 17 (example shown) or may not be constant. From another viewpoint, when viewed on a plane, the shape of the groove 13d may be made a shape of the shape of the terminal 17 made larger by one size or may not be such a shape. The groove 13d may extend with a constant width (example shown) or may extend while changing in width.

In the transversal cross-section of the groove 13d (shape of the cross-section shown in FIG. 4), the width of the groove 13d (distance between the second surface 13f and the wall surface facing this) may be constant in the depth direction of the groove 13d (example shown) or may not be constant. In the latter case, for example, the groove 13d may be shaped so that the width becomes broader toward the opening side (side away from the resistance heating element 15). Conversely, the groove 13d may be shaped so that the width becomes narrower toward the opening side. As a shape in which the width of the groove 13d is substantially constant in the depth direction, for example, there can be mentioned a rectangle (example shown), parallelogram, and these shapes in which at least parts are made curves. Further, as a shape in which the width of the groove 13d becomes larger toward the opening side, for example, there can be mentioned a triangular shape, trapezoidal shape, these shapes in which at least parts are made curves, and semicircular shapes. Further, as a shape in which the width of the groove 13d becomes smaller toward the opening side, for example, there can be mentioned a trapezoidal shape and a trapezoidal shape in which at least parts are made curves. The curve may be made recessed states or may be made projecting states.

As understood from the above explanation, the second surface 13f forming one wall surface of the groove 13d may be made a planar shape (example shown) or may be made a curved shape. Further, the second surface 13f may be perpendicular with respect to the first surface 13c (example shown) or may be inclined.

Figure 5:
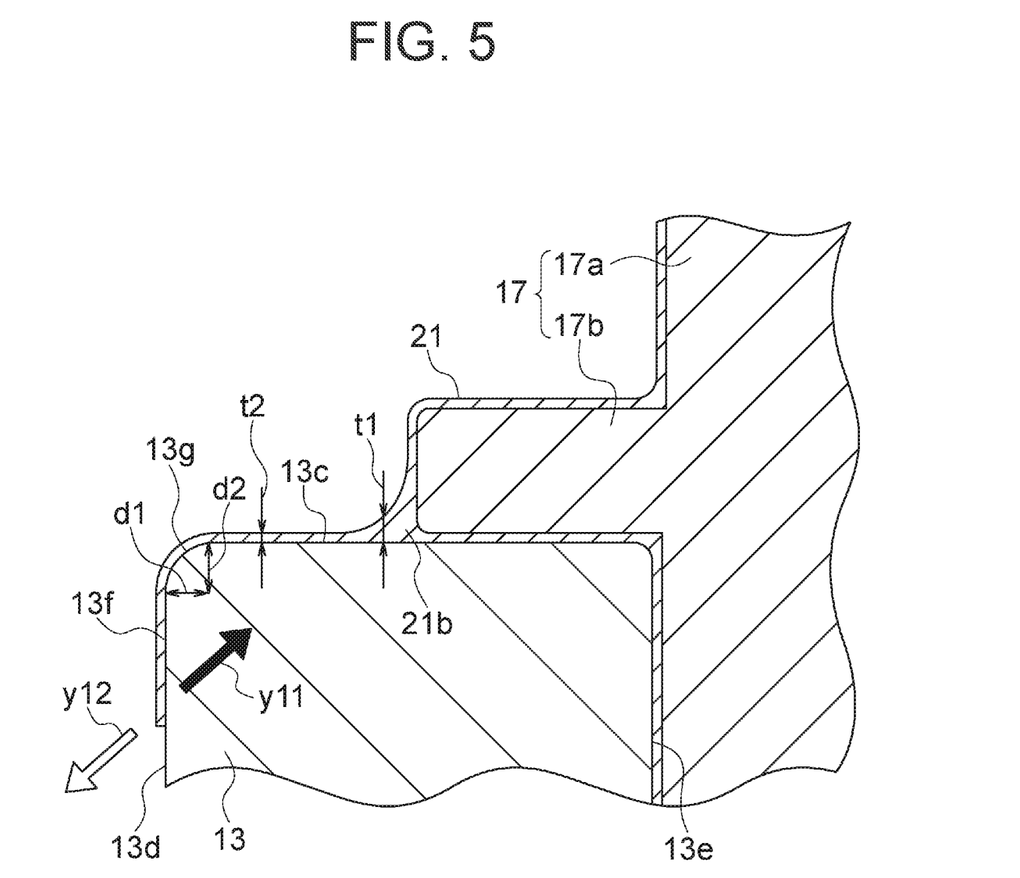
FIG. 5 is an enlarged view of a region V in FIG. 4.

FIG. 5 is an enlarged view of a region V in FIG. 4.

A corner portion formed by the second surface 13f and the first surface 13c may be chamfered by a planar or curved surface (example shown) or such a chamfering may not be carried out. Note that, the "chamfering" referred to here designates a shape with a corner portion removed. The material of the corner portion need not be removed by cutting or polishing etc. The size of the chamfered surface 13g may be suitably set. For example, a length d1 of chamfering of the first surface 13c and a length d2 of chamfering of the second surface 13f may be made 1 time or more or 2 times or more of the thickness on the first surface 13c of the later explained joining layer 21 (for example, an average thickness excluding a specific portion near the terminal 17). Further, the lengths d1 and d2 may be made 10 times or less or 5 times or less of the above thickness of the joining layer 21. The above lower limit and upper limit may be suitably combined.

(Joining Layer)

The base body 13 and the terminal 17 are joined by the joining layer 21. The joining layer 21 is for example at least partially interposed between the base body 13 and the terminal 17. The joining layer 21 may be interposed between the terminal 17 and the resistance heating element 15 and contribute to electrical connection of the same or may not contribute to such connection.

The range in which the joining layer 21 is provided with respect to the terminal 17 may be suitably set. For example, the joining layer 21 may be superimposed on only a portion of the surface of the terminal 17 or may be superimposed on the entire surface of the terminal 17. As the portion of the surface of the terminal 17 in the former example, for example, a facing surface of the flange 17b which faces the first surface 13c can be mentioned. Further, there can be mentioned a combination of the above facing surface and the outer circumferential surface of the part of the terminal body 17a which is inserted in the recessed portion 13e. Further, there can be mentioned a combination of the above facing surface and the outer circumferential surface of the flange 17b. There can be mentioned the entire surface of the terminal 17 excluding at least one of the upper end surface or lower end surface. Further, in a mode where no flange 17b is provided, as the above portion of the surface, there can be mentioned all or part of the outer circumferential surface of the terminal (terminal body 17a).

Further, also the range in which the joining layer 21 is provided with respect to the base body 13 may be suitably set. For example, the joining layer 21 is superimposed on the surface of the base body 13 from at least a portion of the first surface 13c up to a portion of the second surface 13f (from another viewpoint, spreading over the corner portion of the two). Further, the joining layer 21 may be superimposed on all of the first surface 13c (example shown), may be superimposed on part or all of the inner circumferential surface of the recessed portion 13e (example shown), may be superimposed on part or all of the bottom surface of the recessed portion 13e, may be superimposed on all of the second surface 13f, may be superimposed on part or all of the bottom surface of the groove 13d, may be superimposed on part or all of the wall surface in the groove 13d facing the second surface 13f, or may be superimposed on a portion in the lower surface 13b on the outer side from the groove 13d.

In a case where the joining layer 21 is positioned on the end surface on the interior side of the base body 13 in the terminal body 17a and/or the bottom surface of the recessed portion 13e, the joining layer 21 may be filled between the two and join the two or may be divided into two layers of a portion superimposed on the end surface of the terminal body 17a and a portion superimposed on the bottom surface of the recessed portion 13e. Further, the joining layer 21 may be filled in the groove 13d as well. As will be understood from this fact, the joining layer 21 may include a part which does not fit in the concept of a "layer" as well.

The thickness of the joining layer 21 may be suitably set. For example, the thickness of the joining layer 21 may be constant over its entirety, the thickness may be different among a plurality of regions, or the thickness may be different in one region. For example, in the joining layer 21, the thickness of the region interposed between the flange 17b and the first surface 13c may be thinner than, equal to, or thicker than the thickness of interposition between the terminal body 17a and the inner circumferential surface of the recessed portion 13e. Further, for example, the thickness of the region interposed between the terminal 17 and the base body 13 may be thinner than, equal to, or thicker than the region which is not interposed between the terminal 17 and the base body 13. The thickness of each region referred to here may be made for example an average thickness of the region excluding later explained unique portions (thick part 21b etc.). When explaining one example of the thickness of each region, for example, the thickness may be made 5 μm or more or 10 μm or more or may be made 200 μm or less or 100 μm or less. The above upper limit and lower limit may be suitably combined.

The portion in the joining layer 21 which is superimposed on the first surface 13c, for example, has a thick part 21b on the periphery of the terminal 17 (strictly speaking, the flange 17b). The thickness t1 of the thick part 21b becomes thicker than the thickness t2 of the region in the joining layer 21 which is positioned on the side closer to the second surface 13f than this thick part 21b. More specifically, the thick part 21b becomes thicker on the side closer to the terminal 17. When viewed on the cross-section shown in FIG. 5, schematically, it becomes a right angle triangle shape having the first surface 13c and the outer circumferential surface of the flange 17b as the catheti and the surface of the joining layer 21 as the hypotenuse. The thickness t1 of the thick part 21b, for example, at the thickest position (position of a ridge formed by the region in the joining layer 21 which is positioned on the outer circumferential surface of the flange 17b and the surface (hypotenuse) of the thick part 21b) may be made 1.5 times or more, 2 times or more, or 3 times or more of the thickness t2 (average thickness excluding the thick part 21b).

The material of the joining layer 21 is a conductive material. Further, it contains a metal material as the principal ingredient. The joining layer 21 may be configured in its entirety by one type of material or may be configured by two or more types of materials. As the latter example, there can be mentioned a configuration in which layers made of mutually different materials are stacked on each other. Note that, the two or more types of materials may be mixed with each other, and their boundaries may become obscure.

When explaining one example of a case where the joining layer 21 is configured by a plurality of layers, although not particularly shown, the joining layer 21 has the following first layer to fourth layer. The first layer is at least superimposed on the inner surfaces of the recessed portion 13e, the first surface 13c, and the second surface 13f. The second layer is superimposed on the first layer in substantially an equal region to the first layer. The third layer is superimposed on the surface of the terminal 17 in at least a region where the surface of the base body 13 and the surface of the terminal 17 face each other and is interposed between the second layer and the surface of the terminal 17. This third layer may cover over all of the terminal 17 as well. The fourth layer covers a region in the lower surface 13b of the base body 13 on outer side from the terminal 17 (flange 17b) and a region in the terminal 17 which is exposed to the external portion, from the tops of the first to third layers.

The specific material of the joining layer 21 may also be suitably set. For example, the material of the joining layer 21 may be a material which is the same or contains the same principal ingredients as the material of the terminal 17, the material of the internal conductor (resistance heating element 15) and/or the material of the wiring member 7, or may not be such a material. As the material of the joining layer 21 (material of the layers configuring the joining layer 21), use may be made of Ag, Cu, Cr, Ti, or Ni, or an alloy containing one or more selected from among them as the principal ingredient. When illustrating specific materials for one example of the stacked structure described above, for example, the material of the first layer may be made an alloy in which a total mass of Ag, Cu, Cr, and Ti is 50 mass % or more or 80 mass % or more. The material of the second layer and the material of the fourth layer may be made Ni or an alloy containing Ni as the principal ingredient. The material of the third layer may be made an alloy in which the total mass of Ag and Cu is 50 mass % or more or 80 mass % or more.

(Manufacturing Method of Heater)

The method for manufacturing the heater plate 1 may be made for example substantially the same as various known methods excluding formation of the groove 13*d* and the like. One example will be explained below.

First, a base body 13 (green base body 13) made of the raw material of the ceramic before firing is prepared. In the internal portion of the green base body 13, for example, a resistance heating element 15 made of conductive paste before firing (green resistance heating element 15) is buried. Such a green heater plate may be prepared by various conventionally known methods. For example, it may be prepared by stacking of ceramic green sheets on which the conductive paste is arranged.

In the above green base body 13, the recessed portions 13*e* and grooves 13*d* are formed. When the green base body 13 is configured by a stacked body of a plurality of ceramic green sheets, the recessed portions 13*e* and/or grooves 13*d* may be formed before stacking or may be formed after stacking. Further, holes (through-holes or recessed portions) forming the recessed portions 13*e* and grooves 13*d* may be formed in one ceramic green sheet or may be formed over two or more ceramic green sheets.

Next, conductive paste which forms a portion of the joining layer 21 is arranged in a layer state on the inner surface (inner circumferential surface and bottom surface) of the recessed portion 13*e*, the first surface 13*c*, and second surface 13*f*. This conductive paste is for example one for forming the first layer explained above. Part or all of the conductive paste may be placed before stacking of the ceramic green sheets as well. Next, the green base body 13 and conductive paste are fired. After that, metal forming the already explained second layer is formed in a film on the first layer by the vapor deposition process or the like.

In parallel with the above, terminals 17 made of a bulk material (bulk of metal) are prepared. Further, a brazing material forming the already explained third layer in the joining layer 21 is coated on the terminals 17. The terminals 17 coated with this brazing material are inserted into the recessed portions 13*e* in which the second layer is formed and heat treated. Due to this, the terminals 17 and the base body 13 are joined. Further, from the top of this, a metal layer forming the already explained fourth layer is formed in a film by the vapor deposition process or the like. As will be understood from the above explanation, in this example, the surface of the base body 13 is metallized, and the base body 13 and the terminals 17 are joined by the brazing material. The joining layer 21 includes the layer formed by metallizing and the brazing material etc.

As explained above, in the present embodiment, the ceramic structure (heater 1) has the base body 13, metal member (terminal 17), and joining layer 21. The base body 13 is made of ceramic. The joining layer 21 contains metal as the principal ingredient and is positioned between the base body 13 and the terminal 17. The base body 13 has the first surface 13*c* and second surface 13*f*. The first surface 13*c* faces the outer side of the base body 13 and includes at least one (two in the present embodiment) of a region which is superimposed on the terminal 17 and a region which is positioned on the periphery of the terminal 17. The second surface 13*f* intersects with the first surface 13*c* and is positioned on the side closer to the internal portion of the base body 13 on the side away from the first surface 13*c*. The joining layer 21 extends from the terminal 17 and first surface 13*c* up to the second surface 13*f*.

From another viewpoint, the structure with the terminal (heater 1) has the base body 13, internal conductor (resistance heating element 15), terminal 17, and joining layer 21. The base body 13 is an insulating member having the recessed portion 13*e*. The resistance heating element 15 is positioned inside the base body 13. The terminal 17 is inserted in the recessed portion 13*e* and is electrically connected to the resistance heating element 15. The joining layer 21 joins the base body 13 and the terminal 17. The base body 13 has the first surface 13*c* and second surface 13*f*. The first surface 13*c* is positioned on the periphery of the recessed portion 13*e*. The second surface 13*f* intersects with the first surface 13*c* and is positioned on the side closer to the internal portion of the base body 13 on the side away from the first surface 13*c*. The joining layer 21 extends from the terminal 17 and first surface 13*c* up to the second surface 13*f*.

Accordingly, for example, a probability of occurrence of peeling of the joining layer 21 from the surface (first surface 13*c* etc.) of the base body 13 is lowered. As a result, the joining strength of the terminal 17 and the base body 13 is improved. Specifically, for example, this is as follows.

Figure 6:
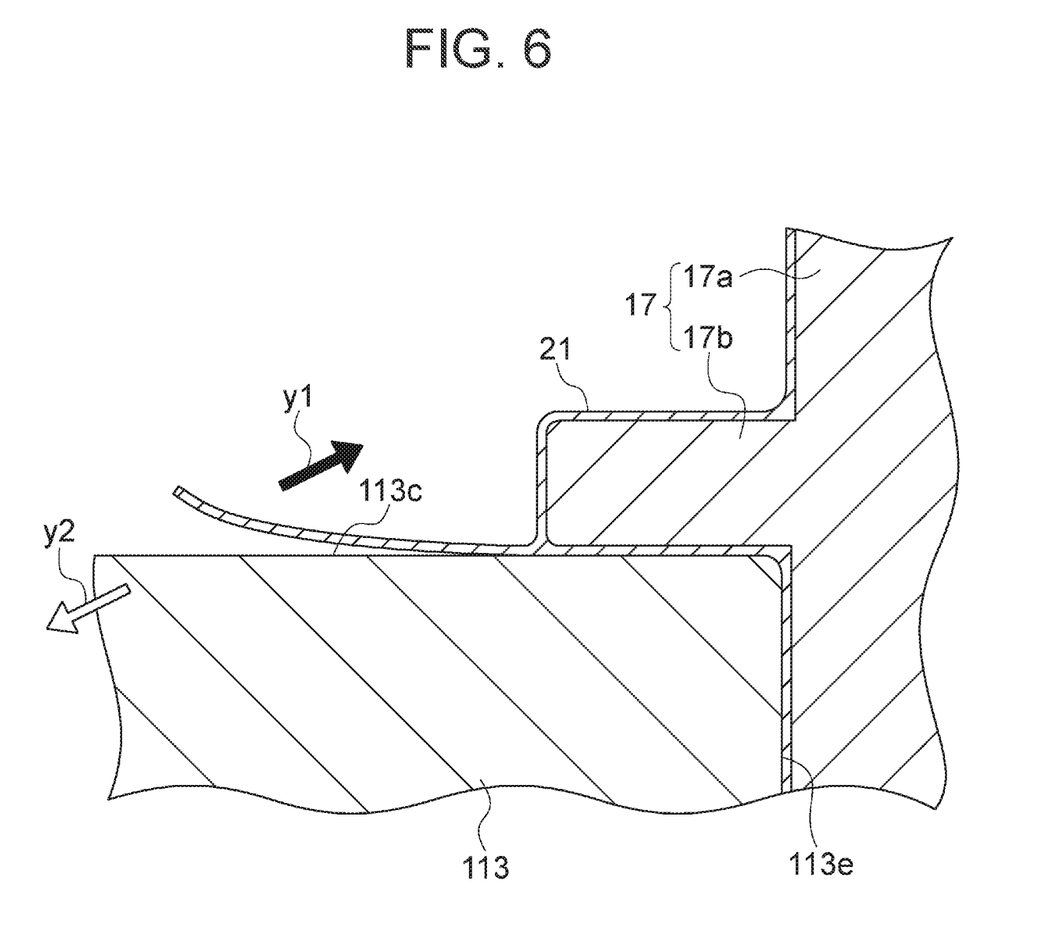
FIG. 6 is a cross-sectional view showing a joining structure of a terminal according to a comparative example.

FIG. 6 is a cross-sectional view the same as FIG. 5, which shows the joining structure of a terminal according to comparative example.

In this comparative example, a base body 113 is the same member as the base body 13 except that no groove 13*d* is provided. Accordingly, the base body 113 has a first surface 113*c* and recessed portion 113*e* corresponding to the first surface 13*c* and recessed portion 13*e*, while does not have the second surface 13*f*. Further, the outer edge of the joining layer 21 is positioned on the first surface 113*c*.

Usually, a linear expansion coefficient of the base body 113 (13) made of ceramic is smaller than the linear expansion coefficients of the joining layer 21 and terminal 17 made of metal. Accordingly, for example, in a situation where the temperature falls in the heater 1, the amount of contraction of the joining layer 21 is larger than the amount of contraction of the base body 113. Further, a force generated due to a difference of thermal expansions of the two acts as a force peeling the joining layer 21 from the first surface 113*c* as indicated by an arrow y1. Further, at this time, peeling is apt to occur from the edge part of the joining layer 21. Note that, in a situation where the temperature rises in the heater 1, a force generated due to the difference of thermal expansions of the two acts as a force in a direction pushing the joining layer 21 against the first surface 113*c* as indicated by an arrow y2.

On the other hand, in the present embodiment, when the temperature falls and the joining layer 21 contracts more than the base body 13, the force generated due to the thermal expansion difference of the two acts as a force pushing the joining layer 21 against the second surface 13*f* as indicated by an arrow y11 in FIG. 5 (corresponding to the arrow y1 in FIG. 6). From another viewpoint, in the joining layer 21, the region positioned on the first surface 13*c* and the region positioned on the second surface 13*f* fasten the base body 13 along with contraction. As a result, the probability of peeling of the joining layer 21 from the surface of the base body 13 is lowered.

In more detail, as in the example shown, when the edge part of the joining layer 21 is positioned on the second surface 13*f*, the probability of peeling of the edge part is lowered. Further, in a case where the edge part of the joining layer 21 is positioned on the bottom surface of the groove 13*d*, at the wall surface of the groove 13*d* which faces the second surface 13*f*, or in the region in the lower surface 13*b* on the outer side than the groove 13*d*, even if the edge part is peeled off, the probability of spread of the peeling beyond the second surface 13f is lowered. Even in a case where the joining layer 21 is filled in the groove 13d, the same effect as that in a case where the joining layer 21 is formed on the second surface 13f etc. is obtained.

Conversely to the above, in a situation where the temperature rises in the heater 1, a force generated due to the thermal expansion difference of the two acts in a direction peeling off the joining layer 21 from the second layer 13f as indicated by an arrow y12 (corresponding to the arrow y2 in FIG. 6). However, this direction, when focusing on the component in the vertical direction, is a reverse orientation to the direction of peeling of the region in the joining layer 21 positioned on the first surface 13c from the first surface 13c. Accordingly, the probability of spread of peeling up to the top of the first surface 13c is lowered.

Note that, in the above explanation, the case where the linear expansion coefficients of the base bodies 13 and 113 were smaller than the linear expansion coefficient of the joining layer 21 was explained. When the relative magnitudes of the two are reverse, the correspondence of the fall of temperature and rise of temperature and the direction in which the force caused by the thermal expansion difference acts becomes reverse to the illustrated ones. Further, in a state where the correspondence is reverse to those shown in the views, similar actions as those described above are generated. That is, in a comparative example, there is a possibility of occurrence of peeling as indicated by the arrow y1 at the time of temperature rise. On the other hand, in the present embodiment, the probability of occurrence of peeling is lowered as indicated by the arrow y11 at the time of temperature rise, and the probability of spread of peeling up to the first surface 13c is lowered at the time of a temperature fall. In this way, the effect by provision of the second surface 13f is not predicated on that the linear expansion coefficient of the base body 13 being smaller than the linear expansion coefficient of the joining layer 21. However, in the explanation of the present embodiment, for convenience, sometimes it is predicated on a case where the linear expansion coefficient of the base body 13 is smaller than the linear expansion coefficient of the joining layer 21.

In the present embodiment, the heater 1 has the internal conductor (resistance heating element 15) which is positioned inside the base body 13. The metal member joined to the base body 13 is the terminal 17 which is electrically connected to the resistance heating element 15.

In this case, for example, by lowering the probability of occurrence of peeling of the joining layer 21 from the base body 13, the probability of occurrence of positional deviation of the terminal 17 with respect to the base body 13 is lowered. In turn, the reliability of electrical connection of the terminal 17 and the resistance heating element 15 is improved.

Further, in the present embodiment, the base body 13 has the recessed portion 13e which is configured by recess of the region surrounded by the first surface 13c. The terminal 17 is positioned in the recessed portion 13e. The joining layer 21 extends from the first surface 13c up to even the inner surfaces of the recessed portion 13e.

In this case, for example, the joining layer 21 grips the portion of the base body 13 between the second surface 13f and the inner circumferential surface of the recessed portion 13e (may be grasped as the projecting portion having the first surface 13c as the top face) by the portion positioned at the second surface 13f and the portion positioned on the inner circumferential surface of the recessed portion 13e. Further, in a situation where the joining layer 21 contracts more than the base body 13, the joining layer 21 fastens the projecting portion. As a result, the effect of suppression of peeling of the joining layer 21 is improved.

Further, in the present embodiment, the base body 13 has the groove 13d which extends so as to surround the terminal 17 and the first surface 13c. The second surface 13f is configured by the wall surface of the groove 13d on the first surface 13c side.

In this case, for example, the second surface 13f can be formed just by formation of the groove 13d. Further, for example, the groove 13d hinders the propagation of stress near the surface of the base body 13, so contributes to dispersion of the stress to the interior side of the base body 13. As a result, for example, the effect of lowering the probability of occurrence of peeling is improved. Further, the groove 13d contributes to lowering of the probability of a short-circuit occurring due to the material forming the joining layer 21 spreading outward when the material is excessively supplied.

Further, in the present embodiment, the terminal 17 has the flange 17b facing the first surface 13c. The joining layer 21 is also positioned between the first surface 13c and the flange 17b.

In this case, for example, the force due to the contraction of the flange 17b is added to the force by which the region in the joining layer 21 positioned at the first surface 13c and the region positioned at the second surface 13f fasten the base body 13 due to contraction of the joining layer 21. Due to this, the effect of suppression of peeling of the joining layer 21 is improved.

Further, in the present embodiment, the corner portion formed by the first surface 13c and the second surface 13f is chamfered.

For example, if the above corner portion is sharp, the probability of the joining layer ending up being split between the region on the first surface 13c and the region on the second surface 13f becomes higher. If the joining layer 21 is split, that split position becomes a new edge part and is positioned on the first surface 13c. As a result, the effects explained with reference to FIG. 5 and FIG. 6 end up being reduced. However, by chamfering the corner portion, such a probability can be lowered. Further, by chamfering, the force of contraction of the region in the joining layer 21 which is positioned on the first surface 13c becomes easier to be transferred to the region in the joining layer 21 which is positioned on the second surface 13f. This transferred force acts as a force pushing the joining layer 21 against the second surface 13f, therefore the effect of lowering of the probability of occurrence of peeling is improved.

Further, in the present embodiment, the first surface 13c has the region surrounding the terminal 17. The portion in the joining layer 21 which is superimposed on the first surface 13c becomes thicker in the thickness on the periphery of the terminal 17 than the thickness t2 on the second surface 13f side (the thick part 21b is formed).

For example, in the comparative example shown in FIG. 6, when the joining layer 21 contracts, a tensile force generated due to this contraction is released by occurrence of peeling in the edge part of the joining layer 21. On the other hand, in the present embodiment, the joining layer 21 is engaged with the second surface 13f and thereby suppresses peeling. As a result, the tensile force is not released and, for example, acts as a force pulling the part on the first surface 13c in the joining layer 21 to the second surface 13f side. The thick part 21b for example contributes to improvement of durability against this tensile force.

(Modifications)

Figure 7A:
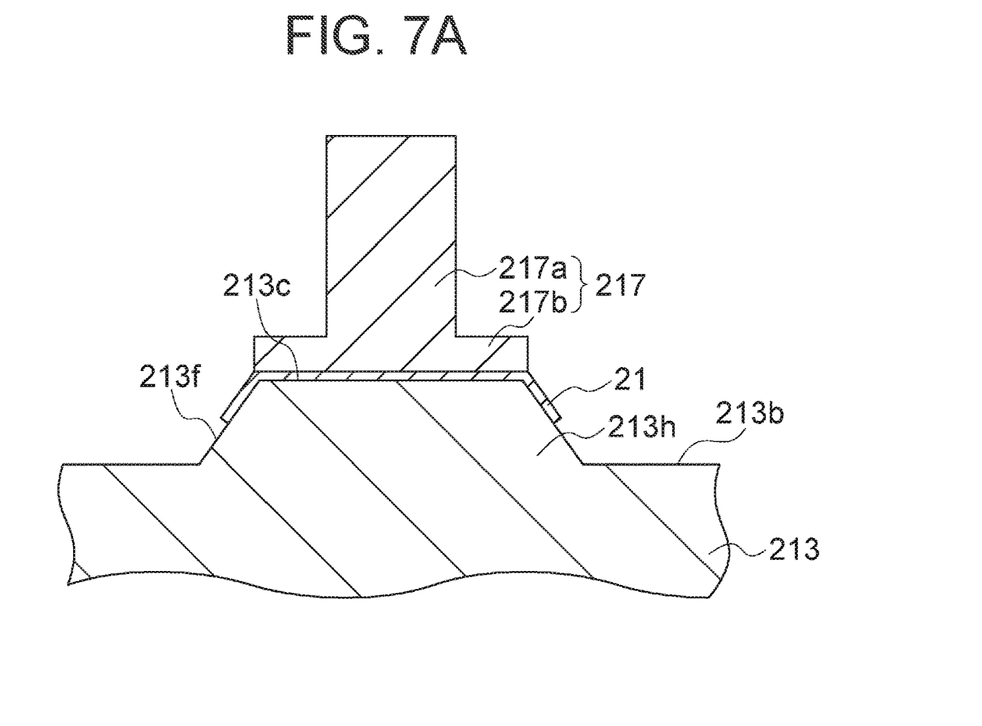
FIG. 7A and FIG. 7B are cross-sectional views showing joining structures according to one modification and another modification.

FIG. 7A is a cross-sectional view showing a joining structure according to a modification and shows also the joining layer 21 in the drawing corresponding to FIG. 4.

In this modification, a base body 213 corresponds to the base body 13 in the embodiment, and a metal member 217 corresponds to the terminal 17. The base body 213 has a first surface 213c facing the external portion of the base body 213 and a second surface 213f which intersects with the first surface 213c and is positioned on the side closer to the internal portion of the base body 213 the further from the first surface 213c. The metal member 217 is joined to the first surface 213c by the joining layer 21. The joining layer 21 extends from the first surface 213c up to the second surface 213f. In such a configuration as well, the same effects as those by the embodiment are exerted. For example, the probability of peeling of the joining layer 21 from the base body 213 is lowered.

As understood from this modification, the second surface 213f is not limited to one configured by forming the groove 13d surrounding the first surface 213c. In this modification, a projecting portion 213h is formed at the lower surface 213b of the base body 213. Further, the first surface 213c is configured by the top face of the projecting portion 213h, and the second surface 213f is configured by the side surface of the projecting portion 213h.

Further, as shown in this modification, the recessed portion 13e need not be provided either. From another viewpoint, the metal member 217 may be only joined with the first surface 213c as well. Further, as shown in this modification, the first surface 213c need not have the region positioned on the periphery of the metal member 217 and may have only a region superimposed on the metal member 217.

In this modification, the metal member 217 may be a terminal or may not be a terminal. When it is a terminal, although not particularly shown, the metal member 217 may be connected to a via conductor passing through the projecting portion 213h or a conductor layer on the lower surface 213b (a portion may be configured by the joining layer 21). As an example where it is not a terminal, for example, a leg simply supporting the base body 213 can be mentioned. Further, although not particularly shown, the metal member 217 may be a member which is hollow shaped and is communicated with respect to a channel opened in the first surface 213c as well.

Note that, in such a mode as well, the second surface 213f, as explained in the embodiment, may be perpendicular to or may be inclined with respect to the first surface 213c (and/or the region on the periphery of the projecting portion 213h in the lower surface 213b), or may be planar shaped, or at least a portion may also be a curved shaped. Further, the joining layer 21 may be positioned in its edge part on the second surface 213f or may be positioned on an outer side from the projecting portion 213h. A corner portion formed by the first surface 213c and the second surface 213f may be chamfered.

Figure 7B:
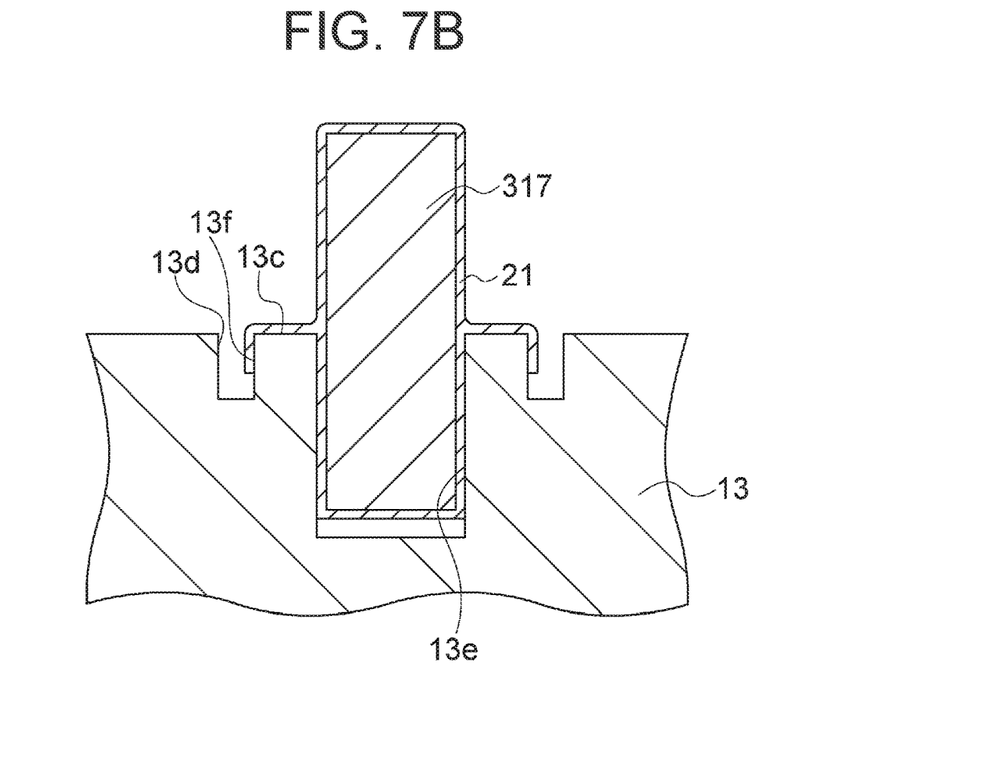

FIG. 7B is a cross-sectional view showing a bonding structure according to another modification, shows the joining layer 21 in the drawing corresponding to FIG. 4. On the other hand, FIG. 7B omits illustration of the internal conductor (resistance heating element 15).

This modification differs from the embodiment only in the point that a terminal 317 does not have a flange 17b. As will be understood from this modification, the first surface 13c may not have a region superimposed on the terminal 317 (metal member) and may have only a region positioned on the periphery of the terminal 317. Although not particularly shown, even in such a modification, a thick part 21b may be provided at the corner portion formed by the outer circumferential surface of the terminal 317 and the first surface 13c.

Note that, in the above embodiment and modifications, the heater 1 is one example of the ceramic structure and structure with terminal. The terminals 17 and 317 are examples of the metal member. The metal member 217 may be grasped as one example of a terminal. The resistance heating element 15 is one example of the internal conductor.

The heater according to the present disclosure is not limited to the above embodiment and may be worked in various ways.

In the embodiment, as the ceramic structure and the structure with terminal, a heater plate having a heating function was taken as an example. However, the structures may be ones having another function as well. For example, the structure may be an electrostatic chuck or plasma generation-use electrode member or may be a structure functioning as a combination of two or more among these and the heater. Further, the structure is not limited to a structure for working a wafer (susceptor etc.) and can be applied to all sorts of technical fields.

From another viewpoint, the internal conductor was a resistance heating element for heating in the embodiment, but may be a conductor for another purpose. For example, the internal conductor may be an electrode for an electrostatic chuck or a plasma generation-use electrode. The ceramic structure and structure with terminal may have a combination of one or two or more of these electrodes and resistance heating element. The internal conductor, as a whole, may be formed as a conductor having a shape that extends along the upper surface of the base body (13) (faces the upper part). Further, for example, when assuming the minimum convex curve surrounding the entirety of the internal conductor when viewed on a plane, the region surrounded by the convex curves may account for 60% or more or 80% or more of the upper surface of the base body.

In the ceramic structure, the metal member is not limited to a terminal, the internal conductor need not be provided, and the base body need not have a recessed portion in which the metal member is inserted. For example, the ceramic structure may be one having a base body as a top board and a metal member as the leg and used to support the other members as well.

In the structure with terminal, the base body is not limited to ceramic, and the joining layer is not limited to one containing metal as the principal ingredients. For example, the base body may be configured by a single crystal, amorphous inorganic material, or resin. Further, for example, the joining layer may be configured by a resin as well.

The method of configuring the second surface may be one other than the method of forming the groove or projecting portion as well. For example, a recessed portion which would be hard to be grasped as a groove may be formed on the periphery of the first surface, and the second surface may be configured by the inner wall of this recessed portion. In the direction around the first surface, only one such recessed portion (from another viewpoint, second surface) may be provided or two or more such recessed portions may be provided. Further, the size of one recessed portion or the size of the sum of the two or more recessed portions may be a size that can be grasped as surrounding the first surface or may be a size which cannot be grasped as that.

The metal member need not project from the first surface either. For example, a metal member shorter than the depth of the recessed portion 13e may be inserted in the recessed portion 13e as well.

REFERENCE SIGNS LIST

1 . . . heater (ceramic structure, structure with terminal), 13 . . . base body, 13c . . . first surface, 13d . . . groove, 13f . . . second surface, 15 . . . resistance heating element (internal conductor), 17 . . . terminal (metal member), and 21 . . . joining layer.

The invention claimed is:

1. A ceramic structure comprising:
a base body made of ceramic;
a metal member; and
a joining layer which contains metal as a principal ingredient and is located between the base body and the metal member, wherein
the base body comprises
a first surface facing an outer side of the base body and including at least either of a region which overlaps the metal member or a region which is located on a periphery of the metal member and
a second surface which intersects the first surface and is located on the side closer to an internal portion of the base body the further from the first surface, and
the joining layer extends from the metal member and the first surface up to the second surface, wherein
the base body comprises a groove which extends so as to surround the metal member and the first surface, and
the second surface is a wall surface in the groove and on a side closer to the first surface, wherein
the first surface comprises a region surrounding the metal member,
in a part of the joining layer which is superimposed on the first surface, a thickness on a periphery of the metal member is thicker than a thickness on a side closer to the second surface.

2. The ceramic structure according to claim 1, further comprising an internal conductor in the base body, wherein
the metal member is a terminal which is electrically connected to the internal conductor.

3. The ceramic structure according to claim 1, wherein
the base body comprises a recessed portion which is surrounded by the first surface,
the metal member is located in the recessed portion, and
the joining layer extends from the first surface up to an inner surface of the recessed portion.

4. The ceramic structure according to claim 1, wherein
the metal member comprises a flange facing the first surface, and
the joining layer is located also between the first surface and the flange.

5. The ceramic structure according to claim 1, wherein a corner portion formed by the first surface and the second surface is chamfered.

6. A structure with terminal comprising:
an insulating base body comprising a recessed portion;
an internal conductor in the base body;
a terminal which is inserted in the recessed portion and is electrically connected to the internal conductor; and
a joining layer which joins the base body and the terminal, wherein
the base body comprises
a first surface on the periphery of the recessed portion, and
a second surface which intersects with the first surface and is located on the side closer to an internal portion of the base body the further from the first surface, wherein
the base body comprises a groove which extends so as to surround the terminal and the first surface,
the second surface is a wall surface in the groove and on a side closer to the first surface, and
in a part of the joining layer which is superimposed on the first surface, a thickness on a periphery of the terminal is thicker than a thickness on a side closer to the second surface.

7. The structure with terminal according to claim 6, wherein
the joining layer extends from the first surface up to an inner surface of the recessed portion.

8. The structure with terminal according to claim 6, wherein
the terminal comprises a flange facing the first surface, and
the joining layer is located also between the first surface and the flange.

9. The structure with terminal according to claim 6, wherein a corner portion formed by the first surface and the second surface is chamfered.

10. A ceramic structure comprising:
a base body made of ceramic;
a metal member; and
a joining layer which contains metal as a principal ingredient and is located between the base body and the metal member, wherein
the base body comprises
a first surface facing an outer side of the base body and including at least either of a region which overlaps the metal member or a region which is located on a periphery of the metal member and
a second surface which intersects the first surface and is located on the side closer to an internal portion of the base body the further from the first surface, and
the joining layer extends from the metal member and the first surface up to the second surface, and
the first surface comprises a region surrounding the metal member, in a part of the joining layer which is superimposed on the first surface, a thickness on a periphery of the metal member is thicker than a thickness on a side closer to the second surface.

11. The ceramic structure according to claim 10, further comprising an internal conductor in the base body, wherein
the metal member is a terminal which is electrically connected to the internal conductor.

12. The ceramic structure according to claim 10, wherein
the base body comprises a recessed portion which is surrounded by the first surface,
the metal member is located in the recessed portion, and
the joining layer extends from the first surface up to an inner surface of the recessed portion.

13. The ceramic structure according to claim 10, wherein
the metal member comprises a flange facing the first surface, and
the joining layer is located also between the first surface and the flange.

14. The ceramic structure according to claim 10, wherein a corner portion formed by the first surface and the second surface is chamfered.

* * * * *